(12) United States Patent
Maschmann

(10) Patent No.: US 6,505,221 B1
(45) Date of Patent: Jan. 7, 2003

(54) FIR FILTER UTILIZING PROGRAMMABLE SHIFTER

(75) Inventor: Martin Maschmann, Munich (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/400,700

(22) Filed: Sep. 20, 1999

(51) Int. Cl.[7] .............................................. G06F 17/10
(52) U.S. Cl. ...................................... 708/306; 708/319
(58) Field of Search ................................ 708/306, 319

(56) References Cited

U.S. PATENT DOCUMENTS

| | | | |
|---|---|---|---|
| 4,344,149 A | 8/1982 | van de Meeberg et al. | 364/724 |
| 4,369,499 A | 1/1983 | Northam | 364/724 |
| 4,494,214 A | 1/1985 | Bernard et al. | 364/724 |
| 4,615,026 A | 9/1986 | Schiff | 364/724 |
| 4,771,395 A | 9/1988 | Watanabe et al. | 364/724.16 |
| 4,782,458 A | 11/1988 | Bhattacharya et al. | 364/724.16 |
| 4,791,597 A | 12/1988 | Miron et al. | 364/724.03 |
| 4,843,581 A * | 6/1989 | Cupo et al. | 708/319 |
| 4,862,402 A | 8/1989 | Shah et al. | 364/724.12 |
| 5,029,121 A * | 7/1991 | Kawata et al. | 708/319 |
| 5,233,549 A | 8/1993 | Chinn | 364/724.16 |
| 5,268,877 A | 12/1993 | Odell | 367/103 |
| 5,353,026 A | 10/1994 | Wilson | 341/143 |
| 5,479,454 A * | 12/1995 | Greggain et al. | 708/319 |
| 5,483,552 A | 1/1996 | Shimazaki et al. | 375/233 |
| 5,513,223 A | 4/1996 | Shoji | 375/350 |
| 5,777,914 A | 7/1998 | Larsson et al. | 364/724.19 |
| 5,928,314 A * | 7/1999 | Pelgrom et al. | 708/319 |
| 6,301,596 B1 * | 10/2001 | Karanovic | 708/319 |

FOREIGN PATENT DOCUMENTS

| | | |
|---|---|---|
| EP | 0 766 388 A2 | 4/1997 |
| GB | 2 233 849 A | 1/1991 |

* cited by examiner

Primary Examiner—David H. Malzahn
(74) Attorney, Agent, or Firm—Gwenaelle Le Pennec

(57) ABSTRACT

A circuit arrangement and method utilize a programmable shifter coupled downstream of a multiplier to shift the product of an input value and a pre-scaled filter coefficient that implements a predetermined filter function. Through the judicious selection of an appropriate pre-scaled filter coefficient and a shift distance to shift the product, truncation errors associated with a digital implementation of a filter may be minimized, offering improved filter response compared to other discrete filter implementations with like coefficient resolution, or in the alternative, permitting acceptable filter response to be maintained with reduced coefficient resolution. Moreover, where the coefficient resolution is reduced, a filter may be implemented using relatively less space, less power consumption and less delay than in comparable conventional designs.

20 Claims, 2 Drawing Sheets

FIR FILTER UTILIZING PROGRAMMABLE SHIFTER

FIELD OF THE INVENTION

The invention is generally related to digital filters, and more particularly, to finite impulse response (FIR) filters and the hardware implementations thereof.

BACKGROUND OF THE INVENTION

Digital filters such as finite impulse response (FIR) filters are used in a number of electronic applications. For example, digital filters are used extensively in wireless communications applications, e.g., in wireless telephone handsets, wireless network hardware, and the like to filter and process incoming wireless signals to recover a data stream therefrom. Typically, but not exclusively, digital filters are implemented on integrated circuit devices along with other control and digital signal processing circuitry.

A digital filter is often required to handle data at a relatively high rate, and as a result, it is often desirable to minimize the internal delays within a digital filter. Moreover, given the constant drive toward miniaturization, it is often desirable for a digital filter to be as compact and occupy as little space as possible on an integrated circuit device. Furthermore, when used in portable applications such as wireless telephone handsets, it is often desirable to minimize the power consumption of a digital filter to assist in extending the overall battery life of a device.

One commonly-used type of digital filter is an finite impulse response (FIR) filter, which has a behavior (in the time domain) generally represented by the equation:

$$y[k] = \sum_{i=0}^{n-1} x[k-i] \times H[i] \quad (1)$$

where n is the number of coefficients, x[k] is the input value at the k-th time step, H[i] is a signed integer FIR filter coefficient, and y[k] is the filtered output value for the filter at the k-th time step.

To implement such a transmission function in hardware, typically separate multiplier and summation stages are utilized, with the multiplier stage configured to generate the product of each input value and filter coefficient, and the summation stage configured to sum the products generated by the multiplier stage to generate a filtered output. In some applications, the multiplier stage is configured to perform each multiplication in parallel using parallel circuitry; however, such parallel circuitry is often too large for a number of space constrained applications. Another approach is to utilize a single multiplier that is sequentially provided with input values and coefficients to generate products to be summed by the summation stage.

Despite advancements in the optimization of multiplier structures (e.g., the Booth-Wallace multiplier design), often the multiplier stage is still the largest and slowest component of an FIR filter. Attempts to reduce the size, power consumption and delay associated with a filter design therefore often focus on reductions to the multiplier stage of the filter.

One manner of reducing the size of a multiplier is to decrease the resolution (or number of bits) of the digital values used to represent the ideal filter coefficients. However, whenever the resolution is decreased, the response of the filter (i.e., the degree to which the actual filter transformation function matches the ideal transmission function for which the filter is designed) also decreases due to increases in the truncation errors that result from rounding and converting the ideal filter coefficients into fixed width digital values. Consequently, the degree in which the resolution of the coefficients can be decreased is often limited by the necessary tolerance range of the filter.

Other approaches attempt to avoid the use multipliers by a manipulation of the FIR filter coefficients. As one example, coefficients may be required to equal an integral power of two, such that multiplication may be performed using a simple and efficient shift register design. As another example, configurable blocks of adders and shift registers may be used to essentially represent each coefficient as a sum of integral powers of two such that multiple shift operations may be performed in parallel on an input value to represent the multiplication of the input value by a coefficient (e.g., multiplication by a coefficient with a value of 10 could be implemented by summing together the results of two shift operations corresponding respectively to multiplication of an input value by 8 and 2).

Each of these approaches, however, can significantly reduce coefficient resolution, requiring additional coefficients to maintain adequate filter response. As a result, additional circuitry is required to handle the additional coefficients, increasing space, power consumption and delay for the filter. Moreover, often the layout of such multiplier alternatives is more difficult and complex than for a multiplier, and the resulting circuit layout is not as efficient. A number of multiplier designs have been highly optimized for compactness, low power consumption and speed, and as a result, the gains associated with such alternate structures over an optimized multiplier are negligible, if at all. In addition, any improvements in size reduction afforded by such alternate structures is often offset by increased delays, making such structures unsuitable for a number of high speed applications.

Therefore, a significant need exists in the art for an improved digital filter design that provides a desirable filter response in less space, with less power, and with less delay than conventional designs.

SUMMARY OF THE INVENTION

The invention addresses these and other problems associated with the prior art by providing a circuit arrangement and method in which a multiplier stage of a digital filter utilizes a programmable shifter coupled downstream of a multiplier to shift the product of an input value and a "pre-scaled" filter coefficient that implements a predetermined filter function. Through the judicious selection of an appropriate pre-scaled filter coefficient and a "shift distance" to shift the product, truncation errors associated with a digital implementation of a filter may be minimized, offering improved filter response compared to other filter implementations with like coefficient resolution, or in the alternative, permitting suitable filter response to be maintained with reduced coefficient resolution. Moreover, where the coefficient resolution is reduced, a filter may be implemented using relatively less space, less power consumption and less delay than in comparable conventional designs.

A pre-scaled filter coefficient consistent with the invention may be used to represent an ideal filter coefficient from a filter function in a number of manners. A pre-scaled filter coefficient may be derived from an ideal filter coefficient through scaling of the ideal filter coefficient by a scaling factor equal to two to the power of the shift distance associated with the pre-scaled filter coefficient. As such, the scaling operation that is inherent in the pre-scaled filter coefficient is negated by the shift operation performed by the programmable shifter.

A pre-scaled filter coefficient may also be derived from an ideal filter coefficient through a rounding operation performed on the product of the ideal filter coefficient and the scaling factor. Furthermore, a pre-scaled filter coefficient may be derived from an ideal filter coefficient through the addition of a correction term to the rounded product of the ideal filter coefficient and the scaling factor. Through the addition of a correction term, often further improvements in filter response can be obtained above and beyond those provided by scaling by a scaling factor.

In general, it will be appreciated that a number of operations may be performed to generate various pre-scaled filter coefficient representations consistent with the invention. Therefore, the invention is not limited to the particular implementations discussed herein.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Embodiments consistent with the invention are generally utilized to efficiently implement a finite impulse response (FIR) digital filter in hardware circuitry. As will become more apparent below, filter size, power consumption and delays can be minimized with little or no adverse impact on filtering quality. For a better understanding of the invention, the following terms will be used hereinafer:

| | |
|---|---|
| H[i] | ideal filter coefficient |
| h[i] | signed integer filter coefficient |
| H*[i] | scaled ideal filter coefficient |
| h*[i] | pre-scaled signed integer filter coefficient |
| n | number of FIR filter coefficients |
| x[k] | k-th FIR filter input value |
| y[k] | k-th FIR filter output value |
| $z_k$ | k-th complex frequency point |
| R | number of points of the discrete (calculated) real transmission function to determine the deviation between the desired transmission function and the achieved transmission function |
| SE | squared error, the summed and squared difference between the discrete (calculated on R frequency points $z_k$) real transmission function and the discretized (calculated on the same R frequency points $z_k$) ideal (desired) transmission function |
| s[i] | shift distance during FIR filter operation |
| c[i] | correction term |
| W | resolution of final FIR filter coefficients |
| T | determines common factor $2^T$ by which ideal FIR filter coefficients are multiplied so that rounded result fits into desired FIR coefficient range ($-2^{W-1} \leq h[i] \times 2^T \leq 2^{W-1} - 1$) |

Moreover, prior to a specific description of the principles behind the use and configuration of such a filter, a brief discussion of one conventional FIR filter design will be provided.

Figure 1:
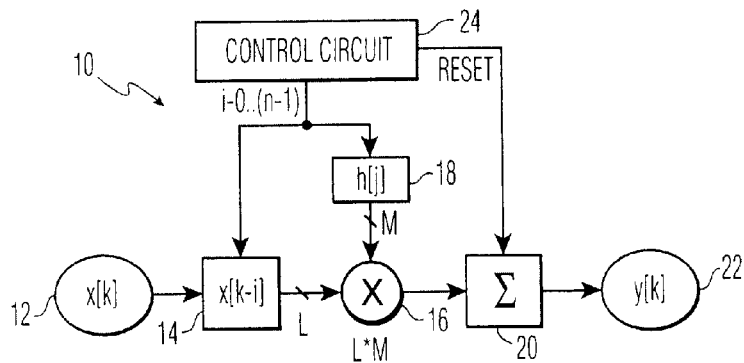
FIG. 1 is a block diagram of a conventional implementation of a finite impulse response (FIR) filter.

Specifically, FIG. 1 illustrates one conventional FIR filter design 10 capable of implementing the transmission function represented by equation (1) above. Filter 10 is configured to receive input data x[k] as represented at 12 and store such input data in an input memory 14 (e.g., a random access memory, bank of registers or latches, or other form of storage device) such that the last n input values are available for computation at any given time step k. The output of input memory 14 is fed to one input of a multiplier 16, the other input of which is coupled to a coefficient memory 18 within which is stored the filter coefficients representative of the transmission function implemented by filter 10. The output of multiplier 16 is fed to a summation circuit 20, which accumulates the values output by the multiplier and outputs the result y[k] at time step k at an output 22.

A control circuit 24 is coupled to each memory 14, 18 to provide a sequence of index values i to direct each memory 14, 18 to sequentially output the appropriate input and coefficient terms to multiplier 16, such that the multiplier sequentially outputs the appropriate products of the input values and the filter coefficients to summation circuit 20. Control circuit 24 is also configured to output a reset signal to summation circuit 20 prior to providing the first terms to multiplier 16, such that once all index values 0 . . . n−1 have been provided to memories 14, 18, the summation circuit will output the correct result at output 22.

Assuming the input data x[k] is represented by an L-bit signed-integer value, and each FIR filter coefficient H[i] is represented by an M-bit signed-integer value (hereinafter designated by the term h[i]), computation of a single output value y[k] requires n L×M signed-integer multiplications, and an L×M multiplier. As discussed above, a multiplier is often a relatively large functional block that consumes a significant portion of the overall power used by the filter, as well as contributes a significant portion of the overall delay of the filter. As such, it is desirable to minimize the size as well as the delay associated with an FIR multiplier. A number of multiplier designs have been developed that optimize the space requirements, power consumption and delay characteristics of a multiplier; however, the reductions in size, power consumption and delay cannot match the reductions that can occur simply through reduction of the resolution of each input value supplied to the multiplier.

Consistent with the invention, the size of a multiplier may be decreased through the use of a multiplier stage in which a variable shift operation is performed on the result of a multiplication of each input value and a "pre-scaled" filter coefficient. The modified filter equation therefore becomes:

$$y[k] = \sum_{i=0}^{n-1} \frac{x[k-i] \times h^*[i]}{2^{s[i]}} \qquad (2)$$

where h*[i] is a pre-scaled signed-integer coefficient, and s[i] is a variable shift distance that the product of the pre-scaled coefficient and the input value x[k−i] is shifted right (equivalent to dividing by $2^{s[i]}$).

Figure 2:
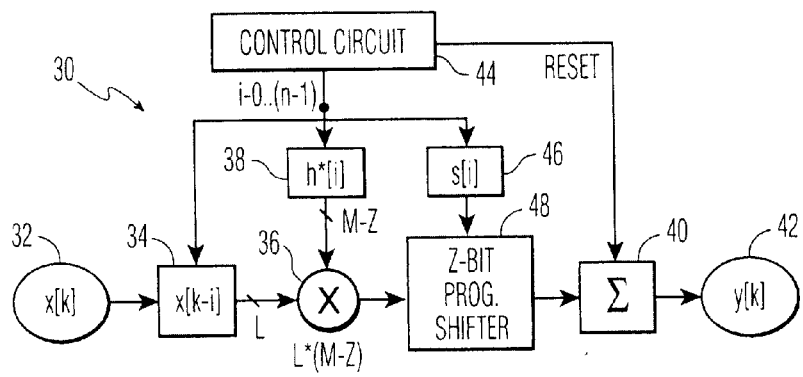
FIG. 2 is a block diagram of an FIR filter consistent with the invention.

One suitable representation of a filter design that may be used to implement the above filter equation is illustrated in FIG. 2 as filter 30, which, similar to filter 10 of FIG. 1, incorporates an input 32, input memory 34, multiplier 36, coefficient memory 38, summation circuit 40, output 42 and control circuit 44. However, unlike filter 10, filter 30 stores pre-scaled coefficients h*[i] in coefficient memory 38, and incorporates a shift memory 46 that stores the shift distance s[i] for each filter coefficient, as well as a programmable shifter 48 interposed between the output of multiplier 36 and summation circuit 40. Shift memory 46 receives an index input from control circuit 44, and in response thereto, outputs the shift distance that the output of multiplier 36 should be shifted to the right by shifter 48.

As will become apparent below, through the use of pre-scaled coefficients and post-multiplication shifting, greater filter performance can be obtained with filter coefficients encoded into fewer bits, represented in FIG. 2 by the pre-scaled coefficients having a width of M−Z (also designated below as W). As a result, the size of multiplier 36 may be reduced to an L×(M−Z) multiplier, thereby saving on size, power consumption and delay. The selection of an optimum value of Z for a particular design will be described in greater detail below in connection with FIG. 5.

A pre-scaled coefficient consistent with the invention incorporates, in the least, a scaling of an associated ideal coefficient by the value of $2^{s[i]}$ prior to rounding and truncation to decrease the error resulting from the rounding and truncation operations. In addition, in some implementations it may also be necessary to scale all of the ideal coefficients by a common factor of $2^T$, such that the largest coefficient fits into the allowed chosen coefficient width W. Put another way, the value of T for use in performing a common scaling operation should be set according to the equation:

$$|\text{round}(\max(h[i]) \times 2^T)| \leq 2^{W-1} - 1 \quad (3)$$

Specifically, an ideal coefficient H[i] may be scaled prior to rounding and truncation, creating a scaled ideal coefficient H*[i]:

$$H^*[i] = H[i] \times 2^T \times 2^{s[i]} \leq 2^{W-1} - 1 \quad (4)$$

where T may be equal to zero if no common scaling operation need be performed.

One implementation of the pre-scaled coefficient consistent with the invention utilizes the scaled ideal coefficient H*[i] rounded and truncated to a W-bit signed-integer, as shown below:

$$|h^*[i]| = |\text{round}(H^*[i])| = |\text{round}(H[i] \times 2^T \times 2^{s[i]})| \leq 2^{W-1} - 1 \quad (5)$$

Through appropriate selection of the shift distance for each pre-scaled coefficient, an advantage is obtained insofar as leading zeros in the signed-integer representations of the filter coefficients can be removed, thereby enabling fractional portions of such coefficients to be stored within the pre-scaled coefficients.

In another implementation of a pre-scaled coefficient consistent with the invention, an additional signed integer correction term c[i] is added to the rounded and truncated scaled ideal coefficient H*[i], as shown below:

$$h^*[i] = \text{round}(H[i] \times 2^T \times 2^{s[i]}) + c[i] \quad (6)$$

Determination of an optimal correction term c[i] for each pre-scaled coefficient may be made in a number of manners, whether through mathematical simulation and analysis or through a straightforward empirical process. Moreover, as will be discussed below in connection with FIG. 5, determination of the optimal correction terms may also be combined with a determination of the optimal shift distances and reduction in coefficient (and hence, multiplier) width. In other embodiments, however, selection of such optimal values may be made independent of one another.

Figure 3:
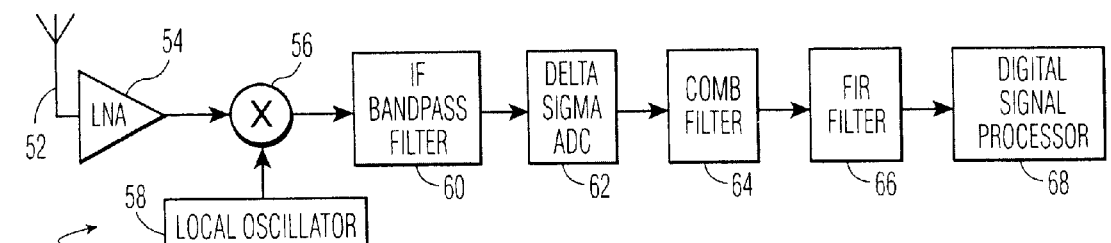
FIG. 3 is a block diagram of the primary electronic components in the receive path of a wireless device incorporating an FIR filter implementation consistent with the invention.

Turning now to FIG. 3, one specific environment suitable for use with a FIR filter design consistent with the invention is in a wireless communication application, e.g., in the receive path of a wireless communication device 50 such as a wireless telephone, the general configuration of which is well known in the art. Device 50 is illustrated as including an antenna 52 that receives a wireless signal and passes the signal to a low noise amplifier 54, the output of which is combined in a mixer 56 with an intermediate frequency (IF) signal from a local oscillator 58 and filtered through an IF bandpass filter 60 to demodulate an analog data signal from the wireless signal. A delta sigma analog digital converter (ADC) 62 receives the analog data signal and generates a digital signal that is fed to a comb filter 64 and then to a digital FIR filter 66 operating as a low pass filter that removes high frequency quantization noise generated by the delta sigma ADC. The output of filter 66 is fed to a digital signal processor 68 to handle the received digital signal in the manner appropriate for the application.

It will be appreciated, however, that an FIR filter consistent with the invention may be utilized in an innumerable number of other electronic devices where FIR filters in general may be used. Examples include other devices utilized in other wireless applications, high speed signal processing applications, etc. Therefore, the invention is not limited to the particular wireless application discussed herein.

Moreover, it will be appreciated that an FIR filter may be incorporated into one or more integrated circuit devices, and that such integrated circuit devices may solely implement the functionality of an FIR filter, or may also implement other functionality consistent with the invention. For example, in the exemplary application illustrated in FIG. 3, it is anticipated that FIR filter 66 could be implemented on a single integrated circuit device with ADC 62, comb filter 64, digital signal processor 68 and other digital hardware circuitry. Also, in applications such as some system on chip (SOC) applications, additional analog circuitry, e.g., LNA 54, mixer 56 and IF bandpass filter 60, may also be incorporated on the same integrated circuit device.

Furthermore, it should be recognized that integrated circuit devices are typically designed and fabricated using one or more computer data files, referred to herein as hardware definition programs, that define the layout of the circuit arrangements on the devices. The programs are typically generated in a known manner by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others, and transmission type media such as digital and analog communications links.

Figure 4:
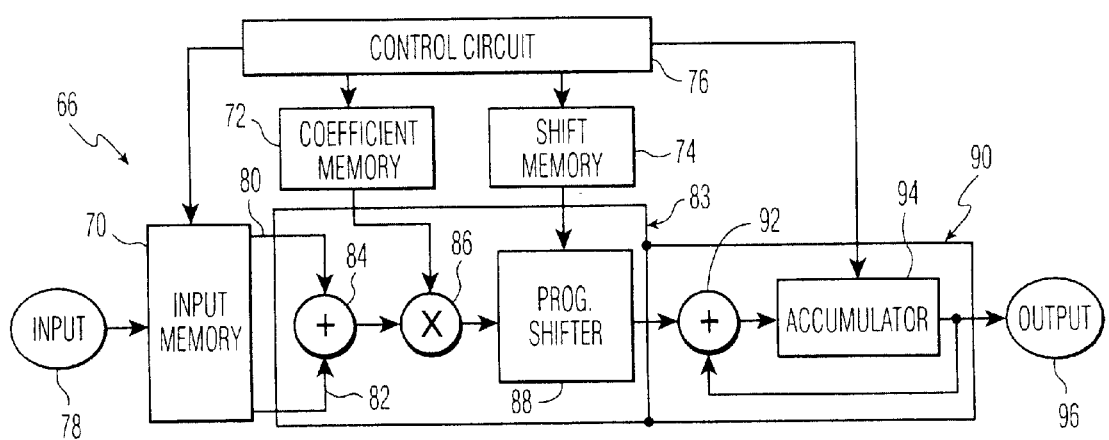
FIG. 4 is a block diagram of the FIR filter of FIG. 3.

Now turning to FIG. 4, one suitable implementation of FIR filter 66 is illustrated, including an input memory 70, coefficient memory 72 and shift memory 74 controlled by a control circuit 76. In the illustrated embodiment, memories 72 and 74 are read only memories (ROM's), although in other implementations reprogrammable memories such as various volatile or non-volatile random access memory (RAM) devices may be used.

Filter 66 is configured to implement a symmetrical FIR function, whereby each filter coefficient meets the condition:

$$h[i]=h[(n-1)-i] \tag{7}$$

With symmetrical filter coefficients, it is possible for input values to be multiplied with symmetrical coefficients to be added together prior to multiplication, i.e., based upon the distributive property ab+ac=a(b+c). Equation (2) above can therefore be modified as follows:

$$y[k] = \sum_{i=0}^{\frac{n}{2}-1} \frac{(x[k-i] + x[k-((n-1)-i)]) \times h^*[i]}{2^{s[i]}} \tag{8}$$

Since all filter coefficients are symmetrical, coefficient memory 72 and shift memory 74 need only store n/2 pre-scaled coefficients and shift distances, respectively (assuming n is even). Moreover, input memory 70 may be configured as a multi-port memory, capable of simultaneously outputting two input values (x[k–i] and x[k–((n–1)–i)]) at ports 80, 82, respectively. It may also be desirable for input memory 70 to also be capable of storing new input values received from input port 78 concurrently with outputting stored input values at ports 80, 82.

The input values output at ports 80, 82 are fed to a multiplier stage 83 including an adder 84, multiplier 86 and programmable shifter 88. Adder 84 receives and sums the input values from ports 80, 82 prior to multiplication in multiplier 86 with a pre-scaled coefficient output by coefficient memory 72. The product of the summed input values and the pre-scaled coefficient is then shifted by programmable shifter 88 based upon a shift distance output by shift memory 74. The shifted product is then fed to a summation stage 90, including an adder 92 which adds the shifted product with a running sum stored in an accumulator register 94, and then stores the new running sum in accumulator register 94. Register 94, which may be reset at the start of a filter calculation by a reset signal from control circuit 76, outputs a filtered output value to an output port 96 for the filter. It will be appreciated that the output of register 94 may be available during the calculation, or may be accessible only through a latching operation at the conclusion of the calculation of a filtered output.

Multiplier 86 in the illustrated embodiment is implemented as a Booth-Wallace multiplier, the use and configuration of which is known in the art. However, based upon the reduced resolution required for the pre-scaled filter coefficients output by coefficient memory 72, a smaller multiplier can be used without sacrificing filter performance. Moreover, it will be appreciated that other multiplier configurations may be utilized in the alternative.

In operation, control circuit 76 is configured to perform a calculation for each input cycle during which a new input value is received at input port 78. During each cycle, control circuit 76 first resets register 94 and stores the new input value received at port 78 in input memory 70. Then, control circuit 76 sequentially provides n/2 control signals to memories 70, 72 and 74 to cause the memories to output the appropriate input values, pre-scaled coefficients and shift distances to implement equation (8) above The design of a control circuit and memory architecture suitable for implementing the above-described sequence of operations would be well within the abilities of one of ordinary skill in the art having the benefit of the instant disclosure. For example, while other architectures may be used, control circuit 76 may be configured to utilize a base pointer that is incremented each filter input cycle to generate the appropriate control signals for input memory 70, such that input memory 70 is logically configured as a circular array.

With the above-described symmetrical configuration, significant advantages can be realized over a non-symmetrical design. From a performance standpoint, a filter calculation can be performed in half the time, given that n/2 multiplications need be performed vs. n multiplications in a non-symmetrical design. Moreover, from a design standpoint, only n/2 filter coefficients and shift distances need be stored, thereby reducing the size of each memory 72, 74 and thus reducing the overall size of the filter. However, it should be appreciated that in other embodiments, the symmetrical nature of the coefficients need not be exploited, e.g., as illustrated above in FIG. 2.

As mentioned above, determinations of the optimal shift distances and pre-scaled filter coefficients may be made in a number of manners, including empirically or through mathematical calculation. Further such determinations may be made independent or collectively in different applications.

Figure 5:
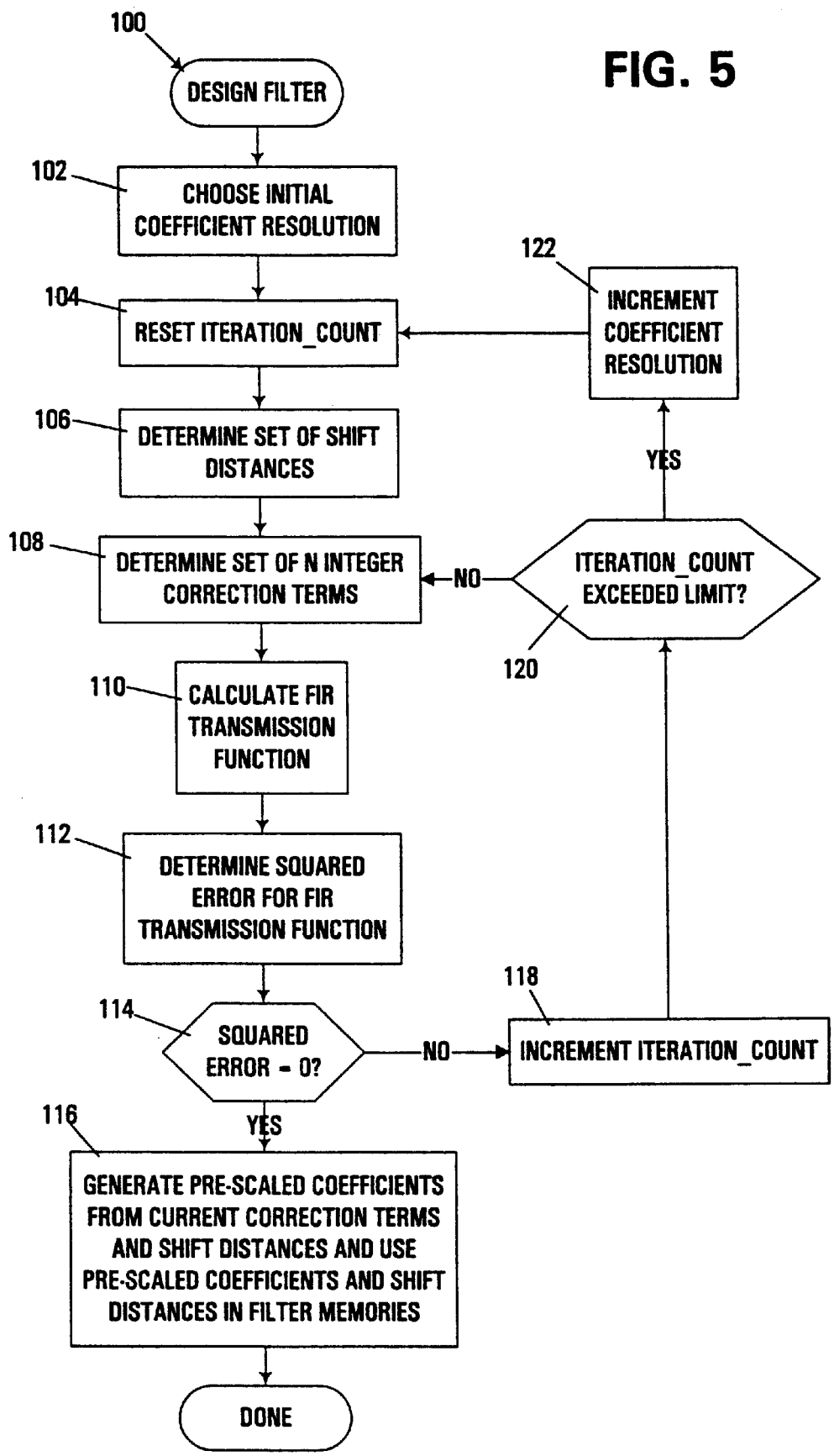
FIG. 5 is a flowchart illustrating the program flow of a design filter routine suitable for determining optimal filter parameters for an FIR filter consistent with the invention.

FIG. 5, for example, illustrates the program flow of a design filter routine 100 that may be executed by a computer to determine the optimal design for a filter. Routine 100 may be implemented, for example, for use with the MATLAB matrix-based math program available from The MathWorks, Inc. Other simulation/modeling tools may also be used in the alternative.

Routine 100 is typically executed after an ideal filter design has been created, including for example a set of n ideal FIR filter coefficients h[i] (where $0 \leq i \leq n-1$), stored in floating point representations, and meeting the requirement:

$$\sum_{i=0}^{n-1} h[i] \cong 1 - |\varepsilon|; \quad \varepsilon \ll 1 \tag{9}$$

Routine 100 begins in block 102 by selecting an initial value to test for the width, or resolution, of the pre-scaled filter coefficients, identified hereinafter as W. For example, one suitable initial value for the coefficient resolution W is one half the output word width of the FIR filter, although other initial values may be selected. Also, at this time it may be necessary in some embodiments to determine the common scaling factor $2^T$ to apply to all of the ideal filter coefficients so that the largest coefficient fits into the selected coefficient width (described above in connection with equation (3)).

Next, block 104 initializes an iteration_count value to zero, indicating that the first iteration is being performed for the initial value of W. In addition, it may also be desirable to initialize an iteration limit, representing the maximum number of iterations to perform for each value of W (e.g., 1000), as well as a resolution value R, representing the resolution of the discretized transmission function (e.g., 1024).

Next, block 106 determines a set of optimal shift distances s[i]. For example, it may be desirable to select each shift distance s[i] to meet the condition:

$$2^{W-1}-3 \geq \text{round}(h[i] \times 2^T \times 2^{s[i]}) \geq 2^{W-2} \qquad (10)$$

The upper limit ($2^{W-1}-3$) is selected based upon the assumption that each correction term will have an absolute value of less than two. It should be appreciated that other shift distance selection methods may be used in the alternative.

Next, block 108 determines a set of n integer correction terms c[i] that meet the condition:

$$2^{W-1}-1 \geq \text{round}(h[i] \times 2^T \times 2^{s[i]}) + c[i] \geq 2^{W-2} \qquad (11)$$

While other selection methods may be used, it may be desirable to simply select random correction terms meeting the above condition, e.g., by selecting each correction term using the equation (a technique known as Monte Carlo simulation):

$$c[i] = \text{round}(4 \times (\text{rand}(\ )-0.5)) \qquad (12)$$

where rand( ) is a function that generates a random number greater than or equal to zero and less than one.

Next, block 110 calculates the transmission function $H^*(z_k)$ for the filter based upon the selected shift distances and correction terms, whereby the transmission function is as follows:

$$H^*(z_k) = \sum_{i=0}^{n-1} \frac{\text{round}(h[i] \times 2^T \times 2^{s[i]}) + c[i]}{2^{s[i]}} z_k^{-i} \qquad (13)$$

where $$z_k = \exp\left(j\pi \frac{k}{R}\right); \quad 0 \leq k < R \qquad (14)$$

The value of R is typically set to be large enough so that all details of the $H^*(z_k)$ transmission function are visible. For example, R may be set to be a value greater than or equal to 10×n, e.g., R=1024.

Once the transmission function is created, the squared error SE, representing the deviation between $H^*(z_k)$ and the required transmission function $H(z_k)$, is calculated. The transmission function, in particular, is required to meet the condition:

$$|H_{up}(z_k)| \geq |H^*(z_k)| \geq |H_{low}(z_k)| \qquad (15)$$

where $H_{up}(z_k)$ and $H_{low}(z_k)$ are the upper and lower tolerance limits for the ideal transmission function.

While other manners may be used to calculate an error associated with the filter design, one manner of calculating an error using an approximation of the squared error is illustrated below in equations (16) and (17):

$$SE = \sum_{l=0}^{R-1} \min((H_{up}(z_l) - H^*(z_l))^2, (H_{low}(z_l) - H^*(z_l))^2) \times v_l \qquad (16)$$

where $$v_l = \begin{cases} 0 & \text{if } |H_{up}(z_k)| \geq |H^*(z_k)| \geq |H_{low}(z_k)| \\ 1 & \text{else} \end{cases} \qquad (17)$$

Next, block 114 determines whether the squared error value is equal to zero, that is, whether the current filter coefficient and shift distance selections are completely within the tolerance range of the ideal filter. If so, the design of the optimal correction terms, shift distances and coefficient resolution is complete, and control can pass to block 116 to generate the pre-scaled filter coefficients from the optimal correction terms and shift distances, and then use the current pre-scaled filter coefficients and shift distances in the filter memories. Routine 100 is then complete. It will be appreciated that the pre-scaled filter coefficients can be generated from the associated correction terms and shift distances by the following equation:

$$h^*[i] = \text{round}(h[i] \times 2^T \times 2^{s[i]}) + c[i] \qquad (18)$$

Returning to block 114, if the squared error is not equal to zero, control passes to block 118 to increment the iteration count. Then, control passes to block 120 to determine whether the iteration count has exceeded the iteration limit. If not, control returns to block 108 to determine a new set of integer correction terms. If so, however, control passes to block 122 to increment the coefficient resolution W (as well as increment the common factor exponent T), and then to block 104 to reset the iteration count and proceed with generating new shift distances and correction terms based upon the new coefficient resolution. As such, the coefficient resolution is incremented sequentially until a suitable set of correction terms and shift distances is found to generate a zero squared error, indicating a suitable filter design.

Implementation of a filter based upon the above-calculated pre-scaled coefficients and shift distances requires the use of a W-bit wide coefficient memory 72 and an L×W multiplier 86 (where L is the width of the input values). Shift memory 74 is required to have a width of at least the log base two of the maximum shift distance, which may be determined using the following equation:

$$\text{maximum shift distance} = \text{round}\left(\frac{\log_{10}\left(\frac{2^{W-1}-1}{2^T \times h[i_{min}]}\right)}{\log_{10} 2}\right) \qquad (19)$$

where $h[i_{min}]$ is the smallest ideal coefficient for the filter design.

Other manners of generating the pre-scaled filter coefficients and shift distances may be used in the alternative. For example, to reduce the amount of processing required by routine 100, techniques other than using random numbers may be used to generate the correction terms. One suitable technique relies on a rapid thermal annealing (RTA) algorithm, whereby the squared error generated in block 112 is used to determine whether a set of correction terms leads to a better solution than another set of terms. A number of RTA algorithms may be used in the alternative, and the use and configuration of such algorithms are well within the abilities of one of ordinary skill in the art having the benefit of the instant disclosure.

It will be appreciated that, to design a filter consistent with the invention, generally an ideal transmission function is defined, then a routine similar to routine 100 is executed to determine the optimal characteristics for a hardware implementation of the filter. Then, layout of the actual filter implementation is performed using the optimal characteristics to define the sizes of the memories and the multiplier, and, if ROM implementations of the coefficient and shift memories are used, to define what data is represented in the memories.

WORKING EXAMPLE

As an example of the reductions in power, space and delay associated with a filter consistent with the invention, consider a 36 tap FIR lowpass filter suitable for receiving 13-bit input values and having the following symmetrical floating-point (ideal) coefficients:

TABLE I

Ideal Floating Point Coefficients (1/36 to 18/19)

| 28.199477 | −8.477851 | −45.563247 | −108.996583 | −127.805011 | −67.971068 |
| 87.600110 | 260.351015 | 328.894213 | 176.844236 | −194.887436 | −621.222760 |
| −806.838999 | −472.008357 | 483.348450 | 1866.984224 | 3238.921565 | 4093.000000 |

Simply truncating these ideal coefficients to 13-bit integer values via conventional rounding resulted in the following coefficients:

TABLE II

Conventional Truncated Coefficients (1/36 to 18/19)

| 28 | −8 | −46 | −109 | −128 | −68 |
| 88 | 260 | 329 | 177 | −195 | −621 |
| −807 | −472 | 483 | 1867 | 3239 | 4093 |

The truncation errors were then:

TABLE III

Conventional Coefficient Truncation Errors (1/36 to 18/19)

| −0.199477 | 0.477851 | −0.436753 | −0.003417 | −0.194989 | −0.028932 |
| 0.399890 | −0.351015 | 0.105787 | 0.155764 | −0.112564 | 0.222760 |
| −0.161001 | 0.008357 | −0.348450 | 0.015776 | 0.078435 | 0.000000 |

Employing pre-scaling, rounding and post-multiplication shifting as described herein (but not including the use of correction terms), the effective filter coefficients (still 13 bits of resolution) became:

TABLE IV

Pre-Scaled Coefficients After Post-Multiplication (1/36 to 18/19)

| 28.203125 | −8.476562 | −45.562500 | −109.000000 | −127.812500 | −67.968750 |
| 87.593750 | 260.375000 | 328.875000 | 176.875000 | −194.875000 | −621.250000 |
| −806.750000 | −472.000000 | 483.375000 | 1867.000000 | 3239.000000 | 4093.000000 |

The truncation errors then dropped to:

TABLE V

Pre-Scaled Coefficient Truncation Errors (1/36 to 18/19)

| 0.003648 | 0.001289 | 0.000747 | −0.003417 | −0.007489 | 0.002318 |
| −0.006360 | 0.023985 | −0.019213 | 0.030764 | 0.012436 | −0.027240 |
| 0.088999 | 0.008357 | 0.026550 | 0.015776 | 0.078435 | 0.000000 |

The reduction of the truncation errors (in %) between Table III and Table V therefore was:

TABLE VI

Percentage Reduction in Truncation Errors (1/36 to 18/19)

| 98.1 | 99.7 | 99.8 | 0 | 96.2 | 91.9 |
| 98.4 | 93 | 81 | 80.3 | 88.9 | 87.7 |
| 45 | 0 | 92.3 | 0 | 0 | 0 |

So, the truncation error was reduced largely by pre-scaling the coefficients. This truncation error reduction was then compensated by the desired coefficient resolution reduction, so that the effective truncation error was essentially the same as with the conventional design, but with the multiplier size substantially reduced.

After implementing the design in VHDL and after synthesis and place and route steps, the area and consumption reduction obtainable were about 17%. This was due to the fact that the multiplier took up only 33% of the entire FIR filter area. The remaining 66% was taken by the filter RAM's (about 60%) and the ROM's and control circuit (6%). The reduction of gate count for the multiplier was significant, in one embodiment decreasing the gate count from 1498 gates (13×13, Wallace, conditional sun) to 823 gates (13×7, Wallace, conditional sum). The calculated delay decreased from 6.58 ns (13×13) to 5.58 ns (13×7), representing a 15% decrease. As a result, the overall area of the filter was reduced by 17% and the achievable speed was increased by 15% (assuming the multiplier is the slowest block in an FIR filter).

Other modifications may be made to the illustrated implementations without departing from the spirit and scope of the invention. Therefore, the invention lies in the claims hereinafter appended.

What is claimed is:

1. A circuit arrangement configured to implement a filter function including at least one filter coefficient, the circuit arrangement comprising:
   (a) scaling means configured to generate a pre-scaled filter coefficient by multiplying a filter coefficient of the filter function by a scaling factor equal to two to the power of a shift distance associated with the pre-scaled coefficient, rounding to an integer value and further summed with a correction term associated with the pre-scaled filter coefficient;
   (b) a multiplier configured to receive an input value and the pre-scaled filter coefficient and output the product thereof; and
   (c) a programmable shifter coupled to receive the product from the multiplier, the programmable shifter configured to generate a shifted product by shifting the product to the right by the shift distance.

2. The circuit arrangement of claim 1, wherein the filter function includes a plurality of filter coefficients, and wherein the circuit arrangement further comprises:
   a coefficient memory coupled to the multiplier, the coefficient memory configured to store a plurality of pre-scale filter coefficients, each pre-scaled filter coefficient being derived by multiplying a respective one of the filter coefficients of the filter function by a scaling factor equal to two to the power of a shift distance respectively associated with the pre-scaled coefficient by rounding to an integer value and by further summing with a correction term associated with the pre-scaled filter coefficient.

3. The circuit arrangement of claim 2, wherein each of the plurality of pre-scaled filter coefficients has a common width W, and wherein each pre-scaled filter coefficient is configured to satisfy the equation:

$$2^{W-1}-1 \geq |\text{pre-scaled coefficient}| \geq 2^{W-2}.$$

4. The circuit arrangement of claim 2, wherein each of the plurality of pre-scaled filter coefficients has associated therewith a shift distance, the circuit arrangement further comprising:
   (a) a shift memory coupled to the programmable shifter, the shift memory configured to store the shift distance associated with each pre-scaled filter coefficient;
   (b) an input memory configured to store a sequence of input values; and
   (c) a control circuit configured to access the input memory, the coefficient memory and the shift memory to respectively output input values and pre-scaled filter coefficients to the multiplier and shift distances to the programmable shifter to generate a plurality of shifted products.

5. The circuit arrangement of claim 4, further comprising a summation circuit configured to sum the plurality of shifted products and thereby generate a filtered output therefrom.

6. The circuit arrangement of claim 4, wherein the plurality of filter coefficients from the filter function includes a plurality of symmetrical filter coefficient pairs, wherein the coefficient memory and the shift memory are each configured to store pre-scaled coefficients and shift distances associated with one filter coefficient from each filter coefficient pair, wherein the input memory includes first and second output ports, each output port configured to output one of the plurality of input values, the circuit arrangement further comprising an adder coupled intermediate the first and second output ports and the multiplier and configured to sum the input values output at the first and second output ports, and wherein the control circuit is further configured to control the input memory to concurrently output at the first and second output ports of the input memory input values associated with both filter coefficients in a filter coefficient pair.

7. The circuit arrangement of claim 1, wherein the filter function is a finite impulse response (FIR) filter function.

8. The circuit arrangement of claim 1, wherein the multiplier includes a Booth-Wallace multiplier.

9. An integrated circuit device comprising the circuit arrangement of claim 1.

10. An electronic device comprising the circuit arrangement of claim 1.

11. A program product, comprising a hardware definition program that defines the circuit arrangement of claim 1; and a signal bearing media bearing the hardware definition program.

12. The program product of claim 11, wherein the signal bearing media includes at least one of a transmission type media and a recordable media.

13. A digital finite impulse response (FIR) filter circuit arrangement, comprising:
   (a) an input memory configured to store a sequence of input values;
   (b) a coefficient memory configured to store a plurality of pre-scaled filter coefficients, each pre-scaled filter coefficient equals an ideal FIR filter coefficient for a predetermined filter function scaled by $2^n$, rounded to an integer value and summed with a correction term associated therewith, wherein n is an integer shift distance;
   (c) a shift memory configured to store the shift distance n associated with each pre-scaled filter coefficient;
   (d) a multiplier configured to receive an input value from the input memory and a pre-scaled filter coefficient from the coefficient memory and output the product thereof;
   (e) a programmable shifter configured to receive the product from the multiplier and the shift distance n associated with the pre-scaled filter coefficient from which the product is generated, and to shift the product by n bits to the right;
   (f) a control circuit configured to access the input memory, the coefficient memory and the shift memory to respectively output input values and pre-scaled filter coefficients to the multiplier and shift distances to the programmable shifter to generate a plurality of shifted products; and
   (g) a summation circuit configured to sum the plurality of shifted products and thereby generate a filtered output therefrom.

14. The circuit arrangement of claim 13, wherein each of the plurality of pre-scaled filter coefficients has a common width W, and wherein each pre-scaled filter coefficient is configured to satisfy the equation:

$$2^{W-1}-1 \geq |\text{pre-scaled coefficient}| \geq 2^{W-2}.$$

15. The circuit arrangement of claim 13, wherein the plurality of filter coefficients from the filter function includes a plurality of symmetrical filter coefficient pairs, wherein the coefficient memory and the shift memory are each configured to store pre-scaled coefficients and shift distances associated with one filter coefficient from each filter coefficient pair, wherein the input memory includes first and second output ports, each output port configured to output one of the plurality of input values, the circuit arrangement further comprising an adder coupled intermediate the first and second output ports and the multiplier and configured to sum the input values output at the first and second output ports, and wherein the control circuit is further configured to control the input memory to concurrently output at the first and second output ports of the input memory input values associated with both filter coefficients in a filter coefficient pair.

16. A method of processing a sequence of input values to generate a filtered output representative of a filter function, the method comprising:

(a) receiving a sequence of input values;

(b) generating a plurality of shifted products, including, for each shifted product;

(i) multiplying an input value from the sequence of input values by a pre-scaled filter coefficient representative of a filter coefficient from a filter function implemented by the filter to generate a product; and (ii) shifting the product to the right by a shift distance associated with the pre-scaled filter coefficient to generate the shifted product; and (c) summing the plurality of shifted products to generate the filtered output;

and wherein, at least one of the pre-scaled filter coefficients is equal to the represented filter coefficient from the filter coefficient multiplied by a scaling factor and rounded to an integer value, and further summed with a correction term associated with the at least one pre-scaled filter coefficient.

17. The method of claim 16, wherein each pre-scaled filter coefficient is scaled relative to the represented filter coefficient from the filter function by a scaling factor equal to two to the power of the shift distance.

18. The method of claim 17, wherein each pre-scaled filter coefficient is equal to the represented filter coefficient from the filter function multiplied by the scaling factor and rounded to an integer value.

19. The method of claim 17, wherein each pre-scaled filter coefficient is equal to the represented filter coefficient from the filter function multiplied by the scaling factor and rounded to an integer value, and further summed with a correction term associated with the pre-scaled filter coefficient.

20. The method of claim 16, wherein each of the plurality of pre-scaled filter coefficients has a common width W, and wherein each pre-scaled filter coefficient is configured to satisfy the equation:

$$2^{W-1}-1 \geq |\text{pre-scaled coefficient}| \geq 2^{W-2}.$$

* * * * *